United States Patent
Sato et al.

(10) Patent No.: US 9,979,506 B2
(45) Date of Patent: May 22, 2018

(54) TRANSMITTER OPTICAL MODULE IMPLEMENTED WITH A PLURALITY OF SIGNAL SOURCES

(71) Applicant: Sumitomo Electric Industries, Ltd., Osaka-shi (JP)

(72) Inventors: Shunsuke Sato, Yokohama (JP); Tomoya Saeki, Yokohama (JP); Munetaka Kurokawa, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 140 days.

(21) Appl. No.: 14/932,022

(22) Filed: Nov. 4, 2015

(65) Prior Publication Data
US 2016/0134388 A1 May 12, 2016

(30) Foreign Application Priority Data

Nov. 6, 2014 (JP) ................................ 2014-226099

(51) Int. Cl.
*H04B 10/50* (2013.01)
*G02B 6/42* (2006.01)
*H04J 14/02* (2006.01)
*H04B 3/32* (2006.01)

(52) U.S. Cl.
CPC ............ *H04J 14/02* (2013.01); *G02B 6/4256* (2013.01); *G02B 6/4284* (2013.01); *H04B 3/32* (2013.01); *H04B 10/503* (2013.01)

(58) Field of Classification Search
CPC ...... H04J 14/02; H04B 10/503; G02B 6/4284
See application file for complete search history.

(56) References Cited

U.S. PATENT DOCUMENTS

| 8,346,037 | B2 | 1/2013 | Pezeshki et al. | |
|---|---|---|---|---|
| 2003/0011853 | A1* | 1/2003 | Wang | H04J 14/0221 398/141 |
| 2006/0140233 | A1* | 6/2006 | Chin | H01S 5/026 372/38.02 |
| 2007/0237465 | A1* | 10/2007 | Okada | G02B 6/4246 385/92 |
| 2009/0145647 | A1* | 6/2009 | Tanaka | H01L 33/62 174/260 |

* cited by examiner

*Primary Examiner* — Nathan Cors
(74) *Attorney, Agent, or Firm* — Venable LLP; Michael A. Sartori; Laura G. Remus

(57) ABSTRACT

A transmitter optical module that implements with two or more laser diodes (LDs) therein is disclosed. The LDs are mounted on a common sub-mount independent of driving circuits and driven by the driving circuits in the shunt-driving mode. The cathode of the LDs are independently, namely, isolated from the ground of the neighbor LDs, connected to the ground within the driving circuits but floated from the chassis ground.

12 Claims, 8 Drawing Sheets

TRANSMITTER OPTICAL MODULE IMPLEMENTED WITH A PLURALITY OF SIGNAL SOURCES

BACKGROUND OF THE INVENTION

1. Field of the Invention

The present application relates to a transmitter optical module implemented with two or more signal sources.

2. Related Background Arts

One type of a transmitter optical module has been known in the field, where the transmitter optical module installs two or more semiconductor laser diodes (LD) each outputting an optical signal with a specific wavelength different from others. Optical signals each output from the LDs are multiplexed and output from the transmitter optical module as a wavelength multiplexed signal. Such a transmitter optical module mounts the LDs and lenses to couple the optical beams to an optical multiplexer on a carrier. The transmitter optical module further installs active and passive electronic components, such as driver circuits to drive the LDs, capacitors, and/or inductors within a housing thereof. When the LDs are driven by signals containing high frequency components sometimes exceeding 10 GHz, assembly of the LDs and components around the LDs are necessary to take degradation of quality of high frequency signals during the propagation thereof into account. Moreover, when the transmitter optical module installs two or more signal lanes, cross talks of the signals between the lanes are also taken into account in the assembly.

SUMMARY OF THE INVENTION

An aspect of the present application relates to a transmitter optical module for outputting a wavelength multiplexed optical signal. The transmitter optical module of the invention comprises two or more laser diodes (LD), a plurality of sub-mounts, two or more drivers, and a housing. The LDs each have cathodes and anodes. The LDs emit optical signals by flowing driving currents from the respective anodes to the cathodes. The sub-mounts each provide at least two die pads at least two bonding pads. The die pads each mount at least two LDs independently thereon and at least two bonding pads for providing driving currents independently to the at least two LDs mounted thereon. The die pads and the bonding pads are independent on the respective sub-mounts. The drivers each correspond to the LDs and have respective signal grounds therein. The drivers include respective switching transistors that shunt the driving currents provided to the anodes of the LDs. The housing encloses the LDs, the sub-mounts, and the drivers therein. The housing provides a chassis ground independent on the signal grounds in the drivers. A feature of the transmitter optical module of the present invention is that the cathodes of the LDs are independently wire-bonded to the signal grounds in the respective drivers without connected to the chassis ground.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENTS

Next, some embodiments according to the present application will be described as referring to drawings. In the description of the drawings, numerals or symbols same with or similar to each other will refer to elements same with or similar to each other without duplicated explanations.

In a transmitter optical module, or a receiver optical module, that processes an electrical signal containing high frequency components reaching or sometimes exceeding 10 GHz or higher, interconnections carrying such high frequency signals inevitably match the characteristic impedance thereof with input and/or output characteristic impedance of the circuit elements. Micro-strip lines and/or co-planar lines, in a width of a metal line and a thickness of a substrate material mounting the metal line thereon, are designed so as to show the characteristic impedance of 50Ω, or 100Ω in a case of the differential transmission line.

However, transmission lines within a housing of a transmitter optical module and a receiver optical module are electrically connected to terminals of the housing and/or devices implemented within the housing by bonding wires. A bonding wire inevitably accompanies with parasitic components of inductance, capacitance, and/or resistance, which makes hard to match the characteristic impedance of the transmission line to be 50Ω or specific characteristic impedance. For instance, a bonding wire with a diameter of 50 μm inherently accompanies with the parasitic inductance of about 1 nH/mm even when the bonding wire is not spiral. Accordingly, a transmitter optical module or a receiver optical module is preferably designed to remove or minimize portions of the interconnections at which the characteristic impedance thereof is mismatched.

When a transmitter optical module implements only one LD, or transmits only one signal corresponding to one lane, an enough space is left around the LD for installing electronic components. However, when a transmitter optical module installs two or more LDs for transmitting two or more signals, only limited spaces are left around respective LDs for mounting electronic components, which makes hard to connect respective LDs with drivers to drive the LDs with bonding-wires in minimum lengths. The embodiments of the present application provide some solutions to make the interconnections to the LDs in shortest without restricting the disposition of the components.

Figure 1:
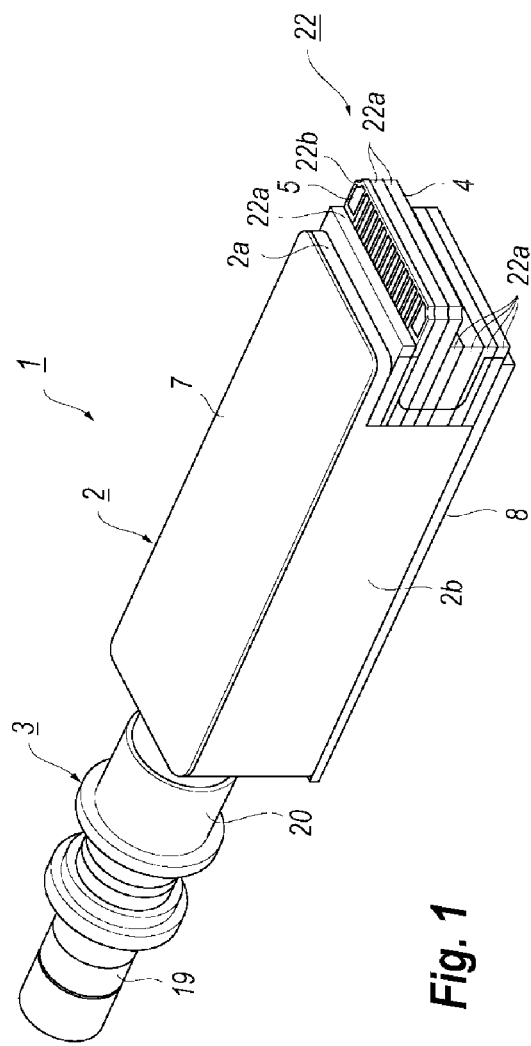
FIG. 1 shows an outer appearance, which is viewed from a rear top, of a transmitter module according to an embodiment of the present application.
Figure 2:
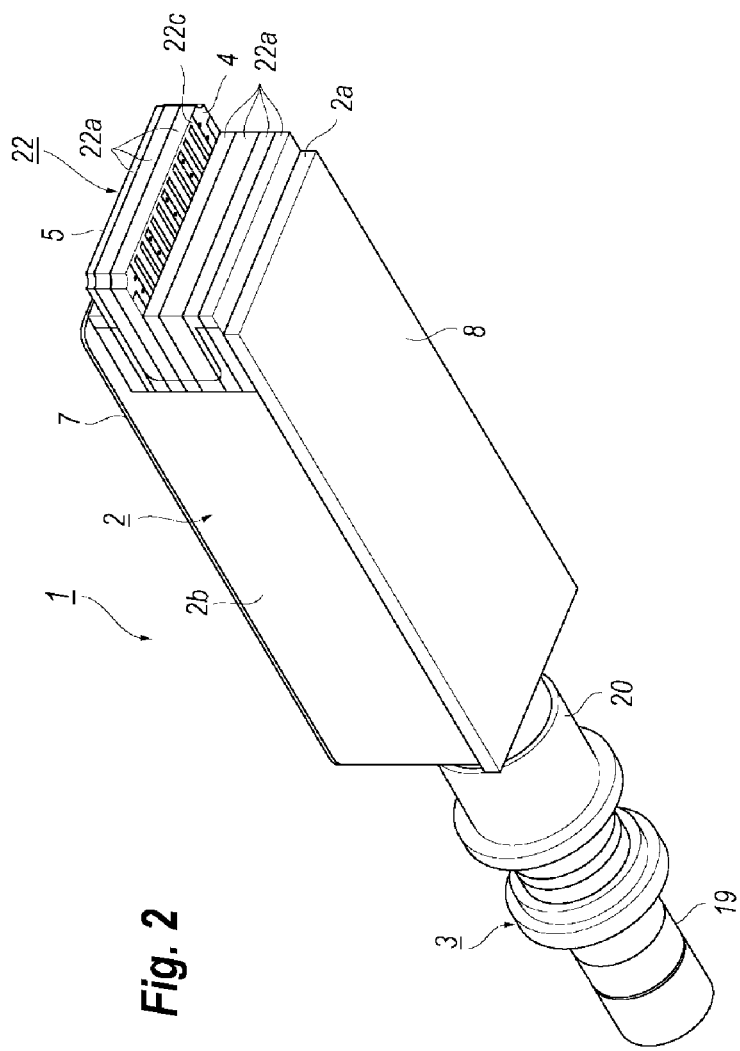
FIG. 2 shows an outer appearance, which is views from a rear bottom, of the transmitter module of the embodiment.

FIG. 1 shows an outer appearance of a transmitter optical module according to an embodiment of the present application, which is viewed from a rear top, and FIG. 2 shows an outer appearance, of the transmitter optical module of the embodiment, which is views from a rear bottom. As shown in FIGS. 1 and 2, the transmitter optical module 1 of the embodiment provides a housing 2 and a coupling portion 3 of a cylindrical shape assembled in one side of the housing 2. The housing 2 arranges, in a rear 2a opposite to the one side where the coupling portion 3 is assembled, RF terminals 4 and DC terminals 5. In the explanation below, a direction indicated by "front" and/or "forward" corresponds to the direction where the coupling portion 3 is assembled, and another direction indicated by "rear" and/or "back" is a side where the terminals, 4 and 5, are provided. However, those directions are only for the explanation sake and could not affect the scope of the present invention.

Because an optical transceiver that implements a transmitter optical module like the present embodiment severely restricts a width thereof, there is no residual space in respective sides of the module. For instance, one multisource agreement (MSA), which is called as the "CFP4" capable of performing the full-duplex optical communication inevitably installing both of a transmitter optical module and a receiver module, defines the width thereof about 21.5 mm, which leaves substantial no space in respective sides of the transmitter optical module arranged in side by side to the receiver module. Accordingly, the transmitter optical module 1 of the present embodiment arranges no terminals in respective sides 2b, and only the rear 2a of the housing 2 extracts RF and DC terminals, 4 and 5.

Figure 3:
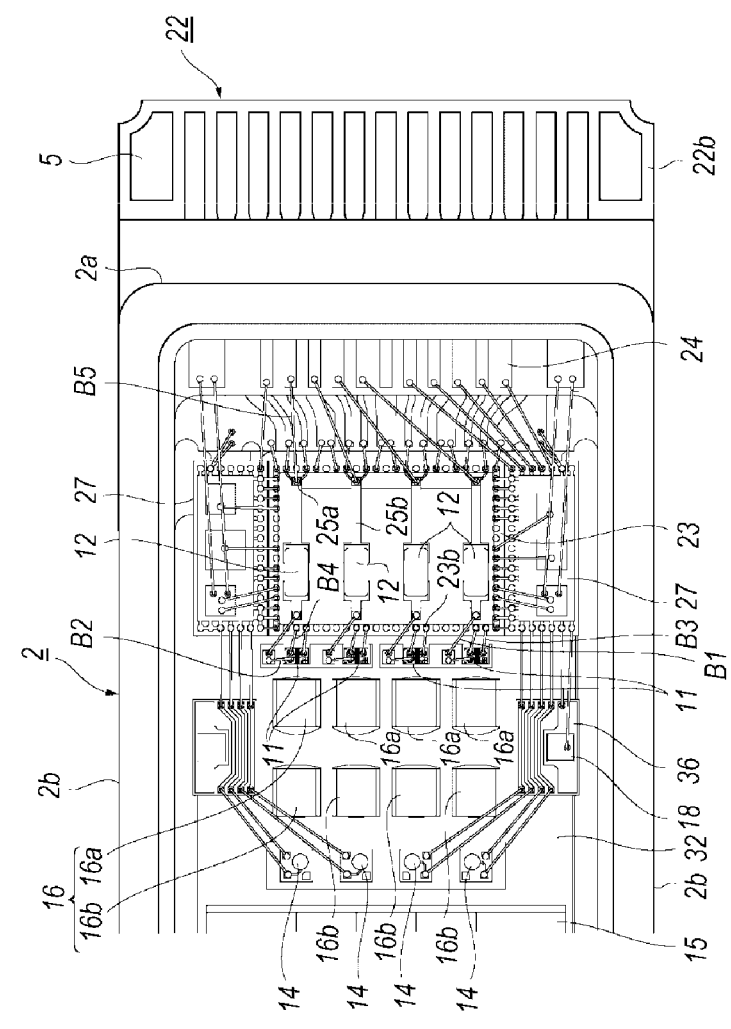
FIG. 3 is a plan view of an inside of the transmitter module shown in FIGS. 1 and 2.
Figure 4A:
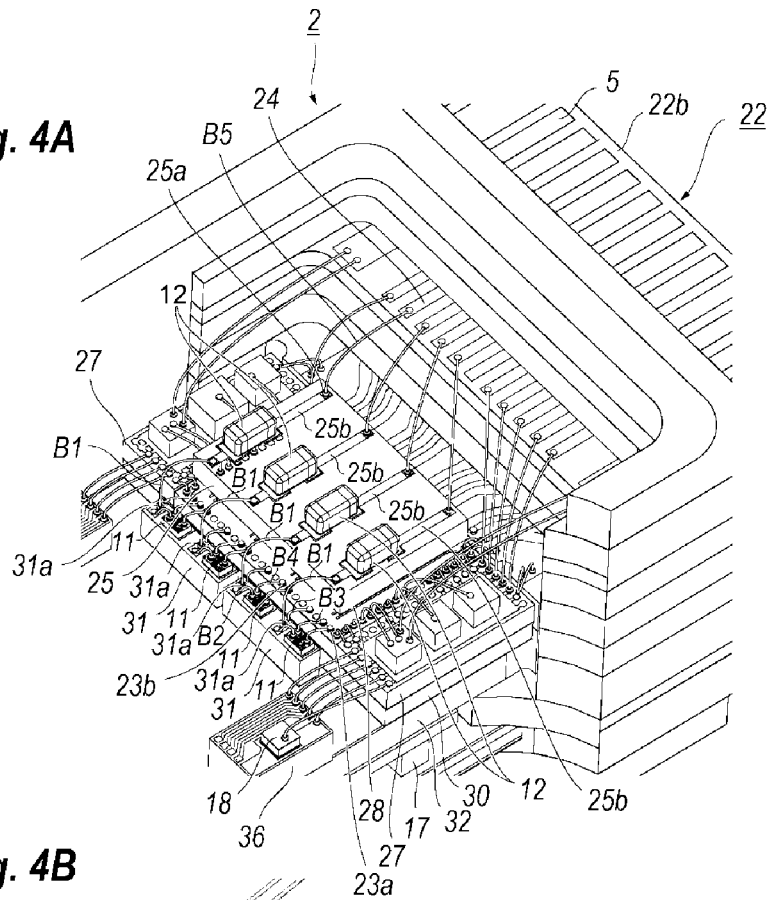
FIG. 4A shows a primary portion of the inside of the transmitter module, and FIG. 4B magnifies a portion where a laser diode (LD) is implemented.

FIG. 3 is a plan view of an inside of the transmitter optical module shown in FIGS. 1 and 2; FIG. 4A shows a primary portion of the inside of the transmitter optical module; and FIG. 4B magnifies a portion where a laser diode (LD) is assembled. As shown in FIG. 3, the transmitter optical module 1 installs a number of optical components and a number of electrical components. The number corresponds to signals to be transmitted from the transmitter optical module 1. The optical components include four LDs 11, four photodiodes (PDs) 14 each sensing output power of respective LDs 11, four lens systems 16 each including the first lens 16a and the second lens 16b, and an optical multiplexer 15 to multiplex optical signals output from the respective LDs 11. The electrical components includes four inductors 12, an integrated circuit (IC) 23 that integrates four drivers for driving the LDs 11, a thermo-electric cooler (TEC) 17 to control a temperature of the LDs 11, a thermistor 18 to sense the temperature of the TEC 17, and so on.

A lid 7 air-tightly and hermetically seals the inside of the housing 2 by, for instance a seam sealer, after the inside of the housing 2 is exchanged with inert gas such as dry nitrogen. The output optical beam, which multiplexes the optical signals output from the respective LDs 11 by the optical multiplexer 15, optically couples with a coupling fiber secured in a center of a stub in the coupling portion after passing through a window made of sapphire set in a side wall to which the coupling portion is assembled.

The coupling portion 3 includes a sleeve cover 19 and a joint sleeve 20. The sleeve cover 19 covers a sleeve that receives an optical ferrule secured in an end of an external fiber. The joint sleeve 20 may optically align the sleeve, exactly the external fiber inserted within the sleeve through the ferrule, with the LDs 11. The sleeve cover 19 and the joint sleeve 20 are welded to the housing 2 after the external fiber is optically aligned with the optical multiplexer 15 by, what is called, the three body alignment so as to attain a preset coupling efficiency between the external fiber and the respective LDs 11. The housing 2 also provides a bottom 8 made of, for instance, copper tungsten (CuW) and a multi-layered ceramics 22 where the RF and DC terminals, 4 and 5, are formed thereon. The TEC 17 is mounted on the bottom 8 of the housing 2 to enhance the heat-dissipating function from the TEC 17 to the outside of the housing 2.

The multi-layered ceramics 22 includes ceramic layers 22a and via holes piercing the ceramics layers 22a. The ceramic layers 22a provide interconnections electrically connected to the RF and DC terminals, 4 and 5, in the outside of the housing 2. Exactly, the multi-layered ceramics 22 provides the DC terminals 5 in the top surface 22b thereof and the RF terminals 4 in the back surface 22c. The RF terminals 4 include four (4) pairs of signal terminals, namely, total eight (8) terminals, to carry four differential signals thereon. The DC terminals 5 includes four terminals to supply biases to the respective LDs 11, two terminals to supply power to the TEC 17, two terminals directed to the thermistor 18, one terminal for supplying power to the IC 23, two terminals for controlling the IC 23, and some ground terminals. Thus, the transmitter optical module 1 implementing two or more signal lanes requires many terminals compared with an arrangement where a transmitter optical module installs only one LD. A conventional transmitter optical module that installs two or more LDs provides DC terminals each for outputting the output of the respective PDs to control respective output power of the LDs. Although the transmitter optical module includes four LDs 11, the present transmitter optical module 1, provides no DC terminals to extract the monitored power from the PDs 14. Instead, the monitored results from the PDs 14 are input into the IC 23, and the IC 23 converts the results into digital forms and outputs through two control lines.

The transmitter optical module 1, as described above, implements four LDs 11 each output respective optical signals, wavelengths of which are specific to the LDs 11 and different form others, and the optical multiplexer 15 to multiplex the optical signals. The explanation below assumes the number of LDs 11 is four (4); but the transmitter optical module 1 may install two or more LDs 11, that is, the number of LDs 11 is not restricted to that of the embodiment.

Referring to FIG. 3, the TEC 17, which is put on the bottom 8 of the housing 2, mounts the IC 23, four LDs 11, four PDs 14, the optical multiplexer 15, and the thermistor 18. The IC 23 mounts four inductors 12 as interposing a spacer 28. Each of LDs 11, each of the inductors 12, each of the PD 14, and each of the lens systems 16 are laterally arranged in side by side, or in an array, with respect to the longitudinal axis of the transmitter optical module 1 connecting the coupling portion 3 to the multi-layered ceramics 22. The thermistor 18 is mounted in a side of the lens system 16 in the present embodiment. However, the transmitter optical module 1 may be implemented with two thermistors disposed in respective sides of the lens systems 16.

Describing the primary portion in the housing 2 further specifically, the TEC 17 mounts the carrier 32 thereon, while, the carrier 32 mounts the IC carrier 30, two sub-mounts 31 for the LDs 11, and a thermistor carrier 36. The IC carrier 30 mounts the IC 23 and the circuit substrate 27 in respective sides of the IC 23. The IC 23, as described above mounts the spacer 28, the spacer 28 mounts the inductor carrier 25, and the inductor carrier 25 mounts the inductors 12 and provides four interconnections 25b each divided into two portions by respective cuts, where the inductors 12 are placed so as to bridge the divided interconnections 25b.

Two sub-mounts 31, which are made of aluminum nitride (AlN), are disposed on the carrier 32 in side by side with respect to the longitudinal direction of the transmitter optical module 1 and sandwiching the IC 23 against the multi-layered ceramics 22. Each of the sub-mounts 31 mounts two LDs 11 also in side by side. Two circuit substrates 27 are disposed in the respective sides of the IC 23. The thermistor carrier 36 is disposed in an opposite side of the circuit substrate 27 with respect to the multi-layered ceramics 22.

Figure 7:
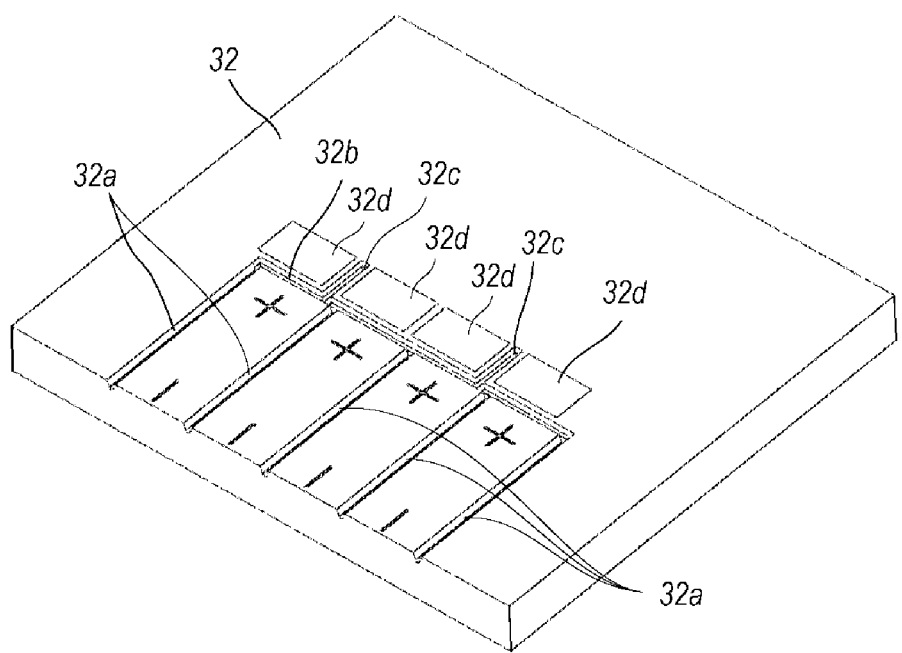
FIG. 7 is a perspective view of a carrier for mounting LDs thereon.

The optical beams each output from the LDs 11 optically couple to the optical multiplexer 15 through respective lens systems 16 each including the first lens 16a closer to the LD 11 and the second lens 16b. These first and second lenses, 16a and 16b, are fixed on the carrier 32 by resin, exactly, ultraviolet curable resin. Referring to FIG. 7, in order to restrict the resin from spreading out to neighbor areas for the lenses, 16a and 16b, the carrier 32 provides grooves 32a for partitioning the areas.

Figure 4B:
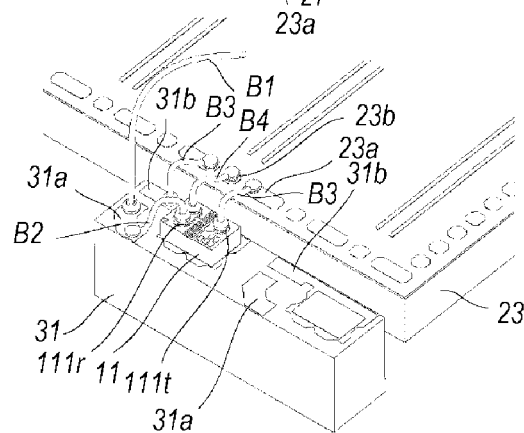

As shown in FIG. 4B, the sub-mount 31 provides two bonding pads 31a and two die pads 31b, where the former pads are provided for bonding wires thereto, while, the latter pads are provided for bonding the LDs 11 thereon. A bonding wire B2 extends from the bonding pad 31a to the top of the LD 11, and other bonding wires, B3 and B4, extend from the pads, 111r and 1ilt, of the LD 11 to the IC 23. Also, another bonding wire B3 is wire-bonded from the die pad 31b in an extra area thereof to the IC 23. The anode electrode of the LD 11 is wire-bonded to the bonding pad 31a on the sub-mount 31, and this bonding pad 31a is wire-bonded to the interconnection 25B on the inductor carrier 25 by the bonding wire B1. The arrangement of the bonding pad 31a and the die pad 31b thus described may enhance the testability in the DC mode of the LD 11 which is die-bonded on the die pad 31b but the sub-mount 31 is only placed on a metal carrier for the DC testing. The die pad 31b on the sub-mount 31 is electrically connected to a back metal provided in the back surface of the sub-mount 31 facing and being electrically in contact to the metal carrier. Probing between the bonding pad 31a and the metal carrier after the wire-boding of the bonding-wire B2 but before the wire-bonding of the bonding wires, B1, B3 and B4, the DC testing of the LD 11 may be easily carried out.

Figure 5A:
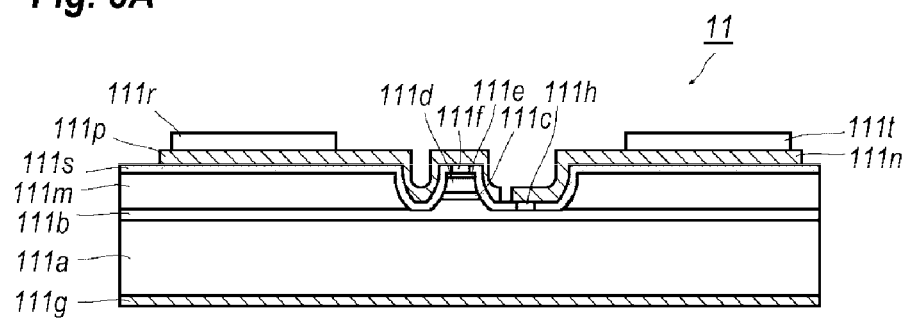
FIG. 5A shows a cross section of the LD.
Figure 5B:
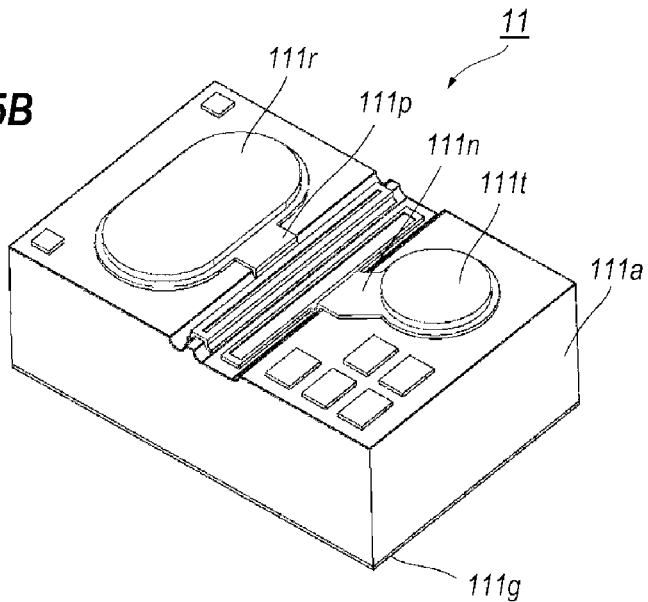
FIG. 5B is a perspective view of the LD.

Next, a structure of the LD 11 will be described. FIG. 5A shows a cross section of the LD 11, and FIG. 5B is a perspective view of the LD. The LD 11 of the embodiment is driven by, what is called, the shunt-driving.

The LD 11, as shown in FIG. 5A, includes a semiconductor substrate 111a, a lower cladding layer 111b, an active layer 111c, an upper cladding layer 111d, and a contact layer 111e. The layers, 111b to 111e, are epitaxially and sequentially grown on the semiconductor substrate 111a in this order and form a mesa in a center of the LD 11. The semiconductor substrate 111a of the present embodiment may be made of an n-type semiconductor material. The LD 11 further provides embedded layers 111m in respective sides of the mesa. Two grooves are formed in respective sides of the mesa so as to scoop out the embedded layers 111m and a portion of the lower cladding layer 111b. Whole surface of the LD 11 are covered with an insulating layer 111s, which is often called as a passivation layer, to protect the mesa and epitaxial layers mechanically and chemically, in particular, the passivation layer 111s may prevent moisture from invading into the grown layers. The passivation layer 111s provides openings in the top of the mesa through which the contact layer 111e exposes, and the bottom of one of the grooves, through which the lower cladding layer 111b exposes. Ohmic electrode 111f is formed in contact to the exposed contact layer 111e, and another ohmic electrode 111h is formed in contact to the exposed lower cladding layer 111b.

An interconnection 111p is extracted from the ohmic electrode 111f on the top of the mesa, and another interconnection 111n is extracted from the other ohmic electrode 111g in the bottom of the groove. The interconnections, 111p and 111n, which extend on the passivation layer 111s, are connected to respective pads, 111r and 1ilt. The LD 11 also provides a back metal 111g in the back surface of the semiconductor substrate 111a. Thus, the LD 11 of the present embodiment may provide electrodes connected to the anode 111f and the cathode 111h both in the top surface thereof. Also, because the semiconductor substrate 111a is made of an n-type semiconductor material, the cathode of the LD 11 may be extracted from the back metal 111g. As shown in FIG. 5B, the LD 11 of the embodiment provides two pads, 111r and 1ilt, for the anode and the cathode of the LD 11. Moreover, the pad 111r has an extended circular shape which makes it easy to wire-bond two wires thereto. In a conventional structure for an edge-emitting LD, one of electrodes, anode or cathode, is inevitably extracted from the back surface of the semiconductor substrate, which greatly restricts the assembly of an LD. Because the LD 11 of the present embodiment provides both the anode and cathode electrodes on the top surface thereof, the assembly of the LD of the embodiment may enhance the flexibility in the assembly thereof.

Figure 6:
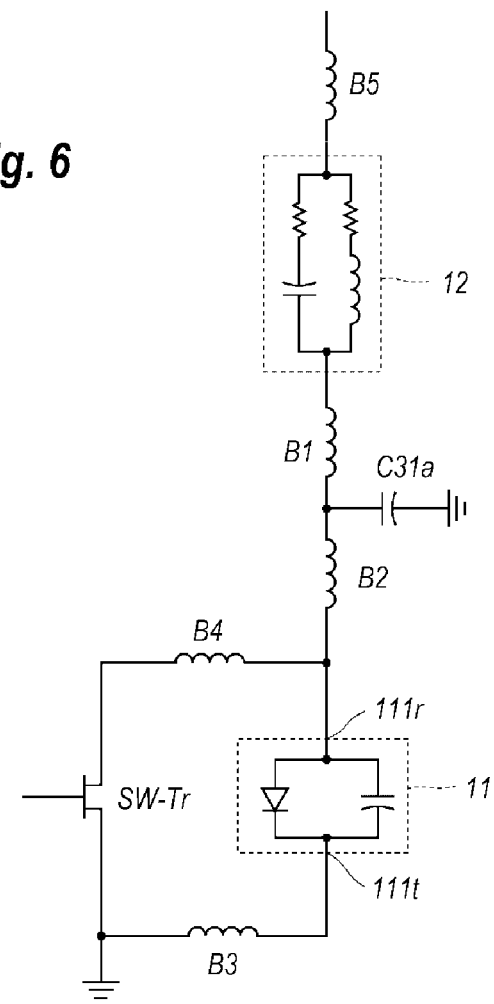
FIG. 6 shows a circuit diagram of a shunt-driver for driving the LD.

FIG. 6 shows a circuit diagram of a shunt-driving circuit for driving the LD 11. The shunt-driving circuit includes a switching transistor SW-Tr to switch a current provided from a current source between the LD 11 and the transistor SW-Tr. Specifically, the transistor SW-Tr, which is connected in parallel to the LD 11, is connected in series to the current source connected in upstream of the bonding wire B5, which is not shown in FIG. 6, through the inductor 12. When the transistor SW-Tr turns on by a driving signal provided to the gate thereof, the driving current coming from the current source in almost all portion thereof flows in the transistor SW-Tr, and the LD 11 is supplied with substantially no current. On the other hand, when the transistor SW-Tr turns off by the modulation signal provided to the gate thereof, the driving current coming from the current source in almost all portions thereof flows in the LD 11. Thus, the LD 11 may be electrically modulated.

Because the driving signal for the LD 11 in frequency components thereof exceeds 10 GHz, the parasitic inductance of the bonding wires, B1 to B5, and the parasitic capacitance $C31a$ of the bonding pad 31a, and so on, must be considered for the operation of the LD 11. However, the parasitic components of the DC terminals 24, the bonding wire B5, the pad 25a, the interconnections 25b, and so on, where those elements are for the DC signals or signals containing only low frequency components, may be ignored. That is, the driving signal output from the IC 23 may leak out to the inductor carrier 25 through the bonding pad 31a and the bonding wire B1; but the bonding wire B2 in the parasitic inductance thereof and the inductor 12 may effectively isolate the interconnection 25b on the inductor carrier 25 from the driving signal.

The current coming from the external current source and flowing in the inductor 12 is supplied to the bonding pad 31a on the sub-mount 31 through the bonding wire B1. Also, as shown in FIG. 4B, the die pad 31b in the extra area thereof, which is connected to the back metal 111g of the LD 11 and to the cathode pad 1ilt or the cathode 111h of the LD 11 within the LD 11 through the semiconductor substrate 111a is wire-bonded to the ground electrode 23a of the IC 23 through the bounding wire B3. The bonding wire B4 connects the anode pad 111r on the LD 11 to the pad 23b on the IC 23. The anode pad 111r is also wire-bonded to the bonding pad 31a by the bonding wire B2. The anode pad 111r on the LD 11 has an elongated circular shape, an almost half of the anode pad 111r is provided for the bonding wire B2, while, the rest of the anode pad 111r is served for the bonding wire B4.

Although the cathode of the LD 11 is grounded through the bonding wire B3 as shown in the circuit diagram of FIG. 6, the connection to the ground is performed within the IC 23. Specifically, the cathode pad lilt of the LD 11 is wire-bonded to the ground pad 23a of the IC 23. Another ground pad 23a of the IC 23, which puts the output pad 23b between two ground pads 23a, is wire-bonded to the extra area of the die pad 31b which is electrically connected to the cathode of the LD 11 through the back metal 111g and the semiconductor substrate 111a. That is, the back metal 111g of the LD 11 is grounded in the IC 23 and connected to the cathode 111h of the LD 11. However, because the sub-mount 31 is made of insulating material, exactly which is made of aluminum nitride (AlN), the die pad 31b is electrically floated from the housing 2 that serves the chassis ground. As described, the die pad 31b on the top of the sub-mount 31 is electrically connected to the back metal provided in the back surface of the sub-mount 31 through interconnections extending in side surfaces of the sub-mount 31. Also, even the back metal of the sub-mount 31 is in contact to the metal pad provided in the carrier 32, the pad on the carrier 32 is electrically isolated from the housing 2 because the carrier 32 is made of insulating material, AlN in the present embodiment. That is, the cathode 111h of the LD 11 is electrically floated from the chassis ground of the housing 2. Moreover, as described above, two bonding wires B3 that are connected to the ground in the IC 23 put the bonding wire B4 between the LD 11 and IC 23, which emulates a micro-strip line to suppress degradation of signal quality propagating on the bonding wire B4.

In the shunt-driving circuit shown in FIG. 6, the current provided through the inductor 12 is shunted between the transistor SW-Tr and the LD 11. This current flows in the bonding wire B3 as a pulsating flow, which induces electro-magnetic interference (EMI) noise. Accordingly, another LD 11 mounted next to the LD under consideration may be affected from the EMI noise, which is often called as crosstalk between the lanes. In the present transmitter optical module 1, the cathode 111h of the LD 11 is grounded in the IC 23, and the die pad 31b, which is the ground pad, is independent of the neighbor die pad 31b. Even when the sub-mount 31 mounts two LDs 11 thereon, the die pad 31b is independent for respective LDs 11 and the back metal of the sub-mount 31 is also independent for respective LDs 11. Moreover, the metal pad provided on the carrier 32 is divided for respective back metals of the sub-mount 31. Thus, the LDs 11 are independently grounded in the IC 23. This arrangement of the die pad 31b, namely, the independent ground pad, may effectively suppress the crosstalk between signal neighbor lanes.

When the die pads 31b for respective LDs have a pattern common in the sub-mount 31, namely, not distinguished from others, the ground noise caused in one LD 11 is affected to an operation of the other LD 11 on the sub-mount 31. When interconnections around the cathode of the LD 11 are formed in enough short, the ground noise may be substantially ignored. However, the interconnections to the cathode practically have substantial lengths, and the crosstalk between the LDs 11 should be inevitably taken into account. In particular, the LDs 11 are driven by respective signals containing high frequency components exceeding 10 GHz, the crosstalk through the ground may be unavoidable.

Accordingly, the transmitter optical module 1 of the present embodiment, the signal ground for the LDs 11 are physically isolated around respective LDs, and connected to the IC 23 to drive the LDs 11. This arrangement of the signal ground may effectively suppress the crosstalk between the signal lanes.

FIG. 7 is a perspective view of the carrier 32 for mounting LDs thereon. The carrier 32 provides four patterns 32d for mounting the sub-mount 31 thereon. Two patterns 32d in one side mount the sub-mount 31, while, other two patterns 32d in another side mount another sub-mount 31. The sub-mount 31 in a back surface thereof facing the carrier 32, provides two back metals corresponding to the patterns 32d. The sub-mount 31 is fixed on the carrier 32 by soldering. However, excess solder sometimes oozes out extending from the metal patterns 32d to the neighbor patterns. Accordingly, the carrier 32 provides grooves 32c between the patterns 32d to prevent surplus solder from oozing out to the neighbor patterns and isolating the patterns. Also, the carrier 32 provides other grooves 32a between areas where the lenses, 16a and 16b, are mounted. These grooves 32a may also absorb surplus resin.

Figure 8:
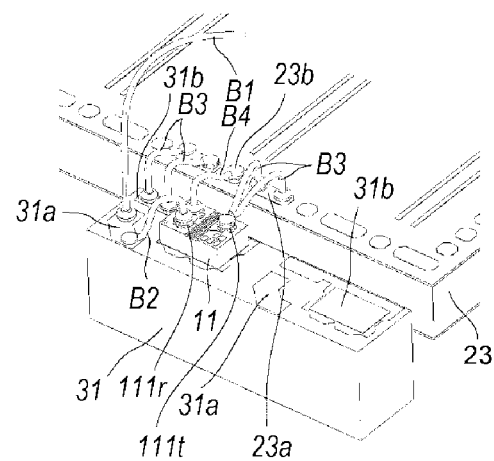
FIG. 8 magnifies a portion around the LD according to a modified example of the present application.

FIG. 8 magnifies a portion around the LDs 11 according to a modified example of the present application. The example shown in FIG. 8 provides duplicated bonding wires B3 connecting the cathode pad lilt on the LD 11 to the ground pad 23a on the IC 23, and other bonding wires B3 connecting the extra area of the die pad 31b to the ground pad 23a on the IC 23. Duplicated bonding wires B3 may lower the impedance thereof to stabilize the ground potential and the operation of the LD 11. Also the crosstalk between the LDs 11 on the common sub-mount 31 may be further effectively reduced.

The foregoing descriptions of specific embodiments of the present invention have been presented for purposes of illustration and description. They are not intended to limit the invention to the precise forms disclosed, and obviously many modifications and variations are possible in light of the above teaching. The embodiments were chosen and described in order to best explain the invention and its practical application, thereby to enable others skilled in the art to best utilize the invention and various embodiments with various modifications as are suited to the particular use contemplated. It is intended that the scope of the invention be defined by the claims appended hereto and their equivalents.

What is claimed is:

1. A transmitter optical module for outputting a wavelength multiplexed optical signal, comprising:
two or more laser diodes (LD) each having a cathode and an anode and emitting an optical signal by flowing a driving current from the anode to the cathode;
a plurality of sub-mounts each providing at least two die pads for mounting at least two LDs independently thereon and at least two bonding pads for providing driving currents independently to the at least two LDs, the die pads and the bonding pads being independent on the sub-mounts, each of the LDs having a top surface and a back surface, the top surface providing the anode and the cathode thereon, the back surface providing a back metal facing and in contact to the die pad on the sub-mount corresponding to the LD but unconnected to the anode and the cathode in the top surface of the LD;
two or more drivers each corresponding to the LDs and having respective signal grounds therein, the drivers including respective switching transistors that shunt the driving currents provided to the anodes of the LDs; and a housing that encloses the LDs, the sub-mounts, and the drivers therein, the housing providing a chassis ground, wherein each of the die pads is independently wire-bonded to each of the signal grounds corresponding to the LD mounted on the die pad, and wherein the cathodes of the LDs are independently wire-bonded to the signal grounds in the respective drivers without being connected to the chassis ground.

2. The transmitting optical module of claim 1,
wherein each of the cathodes of the LDs is wire-bonded to the signal ground in the driver corresponding to the LD by two or more bonding wires.

3. The transmitter optical module of claim 1,
wherein each of the die pads is wire-bonded to the signal ground in the driver corresponding to the LD by two or more bonding wires.

4. The transmitter optical module of claim 1,
wherein each of the anodes of the LDs is wire-bonded to each of the drivers corresponding to the LD by a bonding wire, and
wherein the bonding wire connecting the anode of the LD to the driver corresponding to the LD is sandwiched by a bonding wire connecting the cathode of the LD to the signal ground in the driver corresponding to the LD and another bonding wire connecting the die pad on the sub-mount to the signal ground in the driver corresponding to the LD.

5. The transmitter optical module of claim 1,
further comprising inductors through which the driving currents are provided to the respective LDs,
wherein the drivers are integrated in a common semiconductor device, and
wherein the inductors are mounted on the semiconductor device as putting a spacer therebetween and each of the drivers being connected to the respective anodes of the LDs through bonding wires extending between the inductors and bonding pads on the sub-mounts and other bonding wires connecting the bonding pads to the anodes of the LDs.

6. The transmitter optical module of claim 5,
wherein at least one of the LDs has the anode with an extended circular shape having an area for a bonding wire extending to the driver and a rest area for the another bonding wire extending to the bonding pad on the sub-mount.

7. A transmitter optical module, comprising:
a laser diode (LD) having a cathode and an anode, the LD emitting an optical signal by flowing a driving current from the anode to the cathode, the LD having a top surface and a back surface, the top surface providing the anode and the cathode;
a sub-mount that mounts the LD, the sub-mount providing a bonding pad and a die pad where the LD is mounted thereon;
a driver including a transistor that shunts the current provided to the anode of the LD, the driver providing a signal ground; and
a housing that encloses the LD and the sub-mount therein, the housing providing a chassis ground,
wherein the back surface provides a back metal that faces and is in contact with the die pad on the sub-mount but not connected to the anode and the cathode of the LD,
wherein the die pad is wire-bonded to the signal ground in the driver, and
wherein the cathode of the LD is wire-bonded to the signal ground in the driver without being directly connected to the chassis ground.

8. The transmitting optical module of claim 7,
wherein the cathode of the LD is wire-bonded to the signal ground in the driver by two or more bonding wires.

9. The transmitter optical module of claim 7,
wherein the die pad is wire-bonded to the signal ground in the driver by two or more bonding wires.

10. The transmitter optical module of claim 7,
wherein the anode of the LD is wire-bonded to the driver by a bonding wire which is sandwiched by a bonding wire connecting the cathode of the LD to the signal ground in the driver and another bonding wire connecting the die pad on the sub-mount to the signal ground in the driver.

11. The transmitter optical module of claim 7,
further comprising an inductor through which the driving current is provided to the LD, and
wherein the inductor is mounted on the driver as putting a spacer therebetween and connected to the anode of the LD through a bonding wire extending between the inductor and the bonding pad on the sub-mount and another bonding wire connecting the bonding pad to the anode of the LD.

12. The transmitter optical module of claim 11,
wherein the anode of the LD has an extended circular shape with an area for a bonding wire extending to the driver and a rest area for the another bonding wire extending to the bonding pad on the sub-mount.

* * * * *